United States Patent
Okada et al.

(10) Patent No.: US 6,528,940 B1
(45) Date of Patent: Mar. 4, 2003

(54) CONDUCTIVE LIQUID CRYSTAL DEVICE, AND ORGANIC ELECTROLUMINESCENCE DEVICE

(75) Inventors: Shinjiro Okada, Isehara (JP); Hidemasa Mizutani, Sagamihara (JP); Akira Tsuboyama, Sagamihara (JP); Takao Takiguchi, Tokyo (JP); Takashi Moriyama, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 61 days.

(21) Appl. No.: 09/671,860

(22) Filed: Sep. 28, 2000

(30) Foreign Application Priority Data

Sep. 28, 1999 (JP) .......................................... 11-273879

(51) Int. Cl.[7] .................................................. H01J 1/62
(52) U.S. Cl. ........................ 313/505; 313/504; 313/506
(58) Field of Search ................................ 313/505, 498, 313/500, 502, 503, 504, 506

(56) References Cited

U.S. PATENT DOCUMENTS

| 5,141,785 A | 8/1992 | Yoshinada et al. .............. 428/1 |
| 5,653,913 A | 8/1997 | Nakamura et al. ...... 252/299.01 |
| 5,733,476 A | 3/1998 | Takiguchi et al. ...... 252/299.62 |
| 5,750,214 A | 5/1998 | Ito et al. ......................... 428/1 |
| 5,868,960 A | 2/1999 | Kosaka et al. ......... 252/299.01 |
| 6,312,839 B1 * | 11/2001 | Kim et al. .................. 428/690 |

OTHER PUBLICATIONS

Nature, vol. 371 (1994) (No Month) pp. 141–143. Fast Photo Conduction in the Highly Ordered Columnar Phase of a Discotic Liquid Crystal Adam et al.

Preliminary Communication (Stapff, et al.), pp. 614–617, Multi Layer Light Emitting Diodes Based on Columner Discotics (No Month).

Polymers for Advanced Technologies, vol. 9 (1998), pp. 443–460. Liquid Crystalline Materials for Light–Emitting Diode, Lussemetal (No Month).

* cited by examiner

Primary Examiner—Ashok Patel
Assistant Examiner—Thelma Sheree Clove
(74) Attorney, Agent, or Firm—Fitzpatrick Cella Harper & Scinto

(57) ABSTRACT

In a conductive liquid crystal device, particularly an organic EL device, including a carrier transporting layer of a conductive liquid crystal and a functional organic layer disposed between a pair of electrodes, a protective layer having a carrier transporting characteristic is inserted between the carrier transporting layer and the organic layer. As a result, deterioration, such as the occurrence of molecular association (such as exciplex), at the boundary between the carrier transporting layer and the organic layer can be effectively prevented, whereby a sufficient luminescence can be attained at a lower voltage to improve the durability of the organic EL device.

10 Claims, 2 Drawing Sheets

CONDUCTIVE LIQUID CRYSTAL DEVICE, AND ORGANIC ELECTROLUMINESCENCE DEVICE

BACKGROUND OF THE INVENTION

The present invention relates to an (electro) conductive liquid crystal device used in electronic devices and an organic electroluminescence device using the liquid crystal device.

As for organic electroluminescence devices (hereinafter, the term "electroluminescence" being sometimes abbreviated as "EL" according to a common usage in the field), carrier injection-type EL devices utilizing organic solids, such as anthracene single crystal, were studied in detail. These devices were of a single layer-type, but thereafter Tang et al. proposed a lamination-type organic EL device comprising a luminescence layer and a hole transporting layer between a hole injecting electrode and an electron injecting electrode. The luminescence mechanism in these injection-type EL devices commonly includes stages of (1) electron injection from a cathode and hole injection from an anode, (2) movement of electrons and holes within a solid, (3) re-combination of electrons and holes, and (4) luminescence from single term excitons.

A representative example of the lamination-type EL device may have a structure including an ITO film as a cathode formed on a glass substrate, a ca. 50 nm-thick layer formed thereon of TPD (N,N'-diphenyl-N,N'-di(3-methylphenyl)-1,1'-biphenyl-4,4'-diamine) as represented by a structural formula shown below, a ca. 50 nm-thick layer thereon of Alq3 (tris(8-quinolinolato)-aluminum) as also represented by a structural formula shown below, and further a vacuum deposition layer of Al—Li alloy as a cathode.

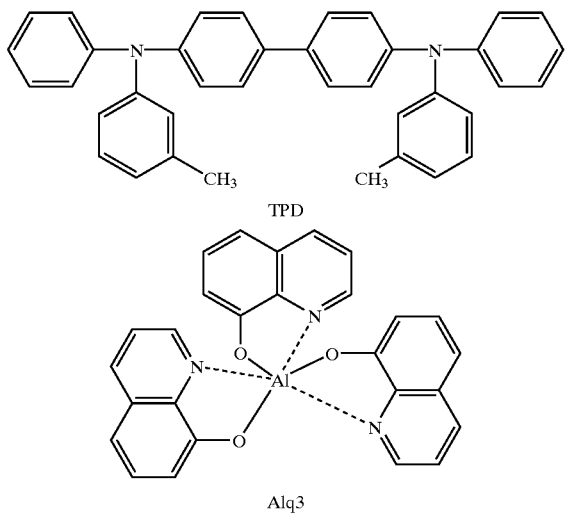

TPD

Alq3

By setting the work function of the ITO used as the anode at 4.4–5.0 eV, the hole injection to TPD is made easier, and the cathode is composed of a metal which has as small a work function as possible and also is stable. Examples of the cathode metal may include Al—Li alloy as mentioned above and also Mg—Ag alloy. By the above organization, green luminescence may be obtained by applying a DC voltage of 5–10 volts.

An example using a conductive liquid crystal as a carrier transporting layer is also known. For example, D. Adam et al. (Nature, vol. 371, p. 141) have reported that a long-chain triphenylene compound as a discotic liquid crystal material exhibited a mobility of $10^{-3}$–$10^{-2}$ $cm^2$/V.sec in its liquid crystal phase (Dh phase) and a mobility of $10^{-1}$ $cm^2$/V.sec in its mesophase (an intermediate phase, not a liquid crystal phase). Also, as for a bar-shaped liquid crystal, Junichi Hanna (Ohyou Butsuri, Appl. Phys., vol. 68, no. 1, p. 26) has reported that a phenylnaphthalene compound exhibited a mobility of $10^{-3}$ $cm^2$/V.sec or higher in its smectic B phase.

As a trial for using such a liquid crystal for electroluminescence, Ingah Stapff et al. (Liquid Crystals, vol. 23, no. 4, pp. 613–617) have reported an organic EL device using a triphenylene-type discotic liquid crystal. Other reports are found in POLYMERS FOR ADVANCED TECHNOLOGIES, vol. 9, pp. 463–460 (1998) and ADVANCED MATERIALS, vol. 9, no. 1, p. 48 (1997).

In a conventional organic EL device, a high electric field (on the order of 10 V/100 nm) has been required for drive because of low performances of injection of electrons and holes from the electrodes, such as ITO, to the organic layers. As organic materials used in an organic EL device have a band gap as broad as ca. 3.0 eV or more, thermal excitation-type free electrons are not present in a conduction band (or LUMO: Lowest Unoccupied Molecular Orbital); a drive current is principally supplied by a tunnel current injected from the electrodes. The injection efficiency of the current is known to be remarkably affected not only by the work functions of the electrodes and a level gap between LUMO and HOMO (Highest Occupied Molecular Orbital) of the organic materials, but also by the molecular alignment and structure of the organic materials. For example, in the case where organic molecules assume a crystalline state, minute crystalline boundaries function as carrier conduction obstacles, so that organic materials are generally used in an amorphous state, but only a low carrier injection efficiency is available in this case.

For the above reason, in order to attain a sufficient drive current using ordinary organic compounds (such as TPD, α-NPD (bis[N-(1-naphthyl)-N-phenyl]benzidine), TAZ-01 (3-(4-biphenyl)-4-phenyl-5-(4-tert-butylphenyl)-1,2,4-triazole), Alq3, etc.) in ordinary EL devices, it has been necessary to apply a high electric field (on the order of 10 V/100 nm) across the organic layer-electrode boundaries. Further, as the mobility of the organic materials is on the order of $10^{-3}$–$10^{-5}$ $cm^2$/V.sec, it is also necessary to apply a high electric field in order to ensure a drive current.

The application of such a high electric field leads to the necessity of thin device layers, which also lead to an electrical short circuit between the electrodes and an increase in capacitance load.

Further, an organic EL device is liable to be affected by invading moisture which causes deterioration of luminance performance and drive performance, thus causing poor durability. In an ordinary organic EL device, the organic layers are disposed in lamination and then the cathode is formed thereon by vapor deposition of a metal film. In this instance, a metal species having a small work function suitable for the cathode is susceptible to oxidation and has low durability. Even in the case of forming a protective film thereon by sputtering, the organic layers are liable to be degraded if the forming temperature is high (with an ordinary limit of 100° C.), and the destruction of the device structure due to film stress is also problematic.

SUMMARY OF THE INVENTION

An object of the present invention is to provide a device including a conductive liquid crystal layer functioning as a carrier transporting layer exhibiting a high carrier injection efficiency and good durability.

Another object of the present invention is to provide a reliable organic EL device capable of providing sufficient luminance at a low applied voltage and exhibiting a long-term stable reliability by including such a conductive liquid crystal device.

According to the present invention, there is provided a conductive liquid crystal device comprising a pair of oppositely spaced electrodes and a carrier transporting layer disposed in contact with one of the electrodes and comprising a conductive liquid crystal having a π-electron resonance structure in its molecule, a protective layer disposed in contact with the carrier transporting layer and having a carrier transporting function, and an organic layer disposed in contact with the protective layer, respectively disposed between the electrodes.

According to the present invention, there is also provided an organic electroluminescence device comprising a pair of oppositely spaced electrodes and a carrier transporting layer disposed in contact with one of the electrodes and comprising a conductive liquid crystal having a π-electron resonance structure in its molecule, a protective layer disposed in contact with the carrier transporting layer and having a carrier transporting function, and a luminescent organic layer disposed in contact with the protective layer, respectively disposed between the electrodes.

A characteristic device structure according to the present invention is one in which a protective layer having a carrier-transporting function is inserted between an organic layer and a carrier transporting layer; through the protective layer, the deterioration at the boundary between the organic layer and the carrier transporting layer, e.g., the occurrence of molecular association (such as exciplex), can be prevented. Another characteristic is the use of a conductive liquid crystal having a π-electron resonance structure in addition to the protective layer, by aligning the π-electron resonance plane of the conductive liquid crystal substantially parallel to the adjacent electrode surface to form a carrier transporting layer, improved performance of carrier injection from the electrode boundary is achieved.

As a result, in the organic EL device according to the present invention, the deterioration at the boundary between the luminescent organic layer and the carrier transporting layer can be suppressed, whereby a sufficient luminescence can be attained at a low voltage thereby reducing power consumption and preventing short circuit between the electrodes and thereby improving the reliability of the organic EL device.

The conductive liquid crystal device of the present invention can be utilized not only in such an organic EL device but also in other electron devices, such as a photosensor, a photoconductor (as in electrophotographic apparatus), an organic semiconductor device (organic TFT), and a spatial modulation device.

These and other objects, features and advantages of the present invention will become more apparent upon consideration of the following description of the preferred embodiments of the present invention taken in conjunction with the accompanying drawings.

DESCRIPTION OF THE PREFERRED EMBODIMENTS

Figure 1:
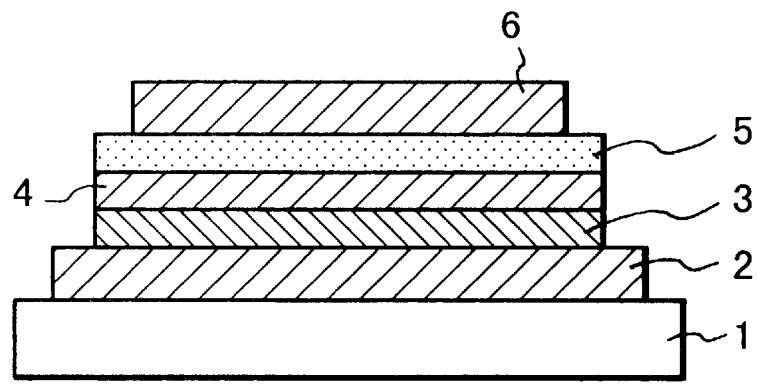
FIG. 1 is a schematic sectional view illustrating an organization of an embodiment of the organic EL device according to the invention.

In the device structure of the present invention, a layer of conductive liquid crystal is used as a carrier transporting layer contacting an electrode, i.e., a charge injection layer, because of the following reason and functions.

(1) Some conductive liquid crystals have a mobility exceeding $10^{-2}$ $cm^2$/V.sec (D. Adam et al., Nature, vol. 371, p. 141).

(2) A conductive liquid crystal has an alignment characteristic because it causes phase transition through temperature change to assume a low order phase, such as a nematic phase or a discotic disordered phase, and can be used in an aligned state on an electrode surface. Such an alignment order can be retained even in a phase below the liquid crystal phase. In this case, the conductive liquid crystal can exhibit various functions attributable to the alignment order in the phase below the liquid crystal phase.

(3) In the case of using a discotic liquid crystal as a conductive liquid crystal, a discotic liquid crystal generally has a structure including a core of, e.g., triphenylene, and side chains attached to the periphery of the core for developing mesomorphism (liquid crystal property). The side chains generally exhibit poor wettability with a metal or metal oxide substrate (such as ITO), so that in the liquid crystal state of the discotic liquid crystal, the core is aligned parallel to the electrode surface, whereby the π-electron resonance plane of the core is aligned parallel to the electrode surface, thereby facilitating carrier transfer with the electrode. Accordingly, it is possible to provide a higher injection efficiency than an ordinary organic compound in an amorphous state.

In this way, by aligning a discotic liquid crystal having hydrophobic side chains relative to an electrode surface, it is possible to improve the efficiency of carrier injection from the electrode to the organic layers. This effect can also be expected for an ordinary bar-shaped liquid crystal having a molecular structure including a phenyl group or a naphthalene group having a π-electron resonance plane.

(4) A molecule exhibiting mesomorphism can change a molecular disposition relative to an electrode surface by a realigning post-treatment. This can also facilitate injection efficiency.

In the above-mentioned utilization of a conductive liquid crystal, a high-order liquid crystal phase having a higher degree of order has a low fluidity, and the alignment in the high-order liquid crystal phase per se is difficult, so that for the purpose of alignment in such a high-order liquid crystal phase, a realigning treatment after heating to a higher temperature phase is required. However, such heating for realignment is not desirable because a heated liquid crystal material, e.g., in a liquid state, is liable to show a strong dissolving power with respect to the other members. Accordingly, in the present invention, it is preferred to use a low-order liquid crystal phase having a better alignment characteristic. However, even such a low-order liquid crystal can deteriorate an organic layer (or a luminescent organic layer in an organic EL device) or a boundary with the organic layer in some cases if it directly contacts the organic layer.

However, in the present invention, deterioration of the organic layer or the boundary with the organic layer can be prevented by disposing a protective layer between the carrier transporting layer comprising a conductive liquid crystal and the organic layer.

More specifically, in the case where a liquid crystal layer directly contacts a luminescence layer, a molecular association (exciplex) is liable to be formed between a liquid crystal molecule and a luminescent organic molecule at the boundary therebetween or within the luminescence layer due to liquid crystal molecules diffused into the luminescence layer. Such an exciplex, when formed, functions as a stable electron-exciting species and is liable to change the luminescence performance.

Such an exciplex is formed by charge transfer or excitation resonance between an excited molecule and a non-excited molecule. The formation of such an exciplex can be prevented by measures such as (1) increasing an excitation energy difference between the contacting molecules, (2) equalizing the acceptor or donor characteristic of the contacting molecules, (3) using a single type of carriers (holes or electrons), and (4) using a non-planar boundary structure. The measure (4) is, however, not useful in combination with a liquid crystal material contemplated in the present invention. In the present invention, a protective layer having a carrier transporting function in the present invention is used so as to have the protective layer suppress the formation of such exciplexes owing to any one of the above-mentioned measures (1)–(3).

Hereinbelow, the organization of the device will be described more specifically.

In the present invention, the conductive liquid crystal constituting the carrier transporting layer may suitably have a π-electron resonance structure, which is generally given by an aromatic ring. Examples thereof may include triphenylene ring, naphthalene ring and benzene ring, as representative, and also pyridine ring, pyrimidine ring, pyridazine ring, pyrazine ring, tropone ring, azulene ring, benzofuran ring, indole ring, indazole ring, benzothiazole ring, benzoxazole ring, benzimidazole ring, quinoline ring, isoquinoline ring, quinazoline ring, quinoxaline ring, phenanthrene ring and anthracene ring.

The conductive liquid crystal used in the present invention may preferably comprise a discotic liquid crystal or a smectic liquid crystal. A discotic liquid crystal may generally have a core structure which may be given by an aromatic ring as mentioned above for the π-electron resonance structure, as represented by triphenylene ring (or skeleton). Further examples thereof may include truxene skeleton, metal-phthalocyanine skeleton, phthalocyanine skeleton, dibenzopyrene skeleton, dibenzopyrene skeleton, and hexabenzocoronene skeleton.

Specific examples of the discotic liquid crystal preferably used in the present invention may include HHOT (hexakis(hexyloxy)triphenylene and PFT-1 (hexakis(pentafluorooctyloxy)triphenylene represented by the following structural formulae:

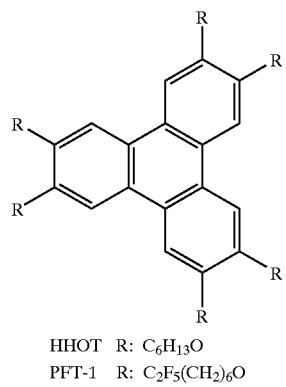

HHOT  R: $C_6H_{13}O$
PFT-1  R: $C_2F_5(CH_2)_6O$

To supplement, the discotic liquid crystal phases may be classified into a discotic nematic phase and a discotic columnar phase, and the discotic columnar phase is further divided into a discotic disordered phase and a discotic ordered phase which has a higher order than the discotic disordered phase.

A higher mobility is exhibited by a liquid crystal having a discotic ordered phase, but in view of carrier injection performance from an electrode surface, a liquid crystal having a discotic disordered phase can exhibit a better performance because of its better alignability of the π-electron resonance plane parallel to the electrode surface. Thus, a liquid crystal having a discotic disordered phase is preferably used to constitute a carrier transporting layer according to the present invention.

On the other hand, it is also possible to use a smectic liquid crystal having a bar-shaped molecular structure and assuming a smectic phase in a prescribed temperature range as a conductive liquid crystal for constituting the carrier transporting layer in the device of the present invention. It is particularly preferred to use a smectic liquid crystal having SmE phase or a smectic phase of a lower order than SmE.

The carrier transporting layer of a conducive liquid crystal according to the present invention may be formed by vacuum deposition on an electrode. The layer of conductive liquid crystal after vacuum deposition is assumed to have an amorphous state, i.e., isotropic, indefinite and bulky alignment state. Liquid crystal molecules in such an alignment state can readily cause an alignment change at a liquid crystal phase temperature. Accordingly, in a device including a carrier transporting layer formed by vacuum deposition of a conductive liquid crystal, it is possible to easily realign the π-electron resonance plane parallel to an associated electrode surface by an appropriate heating treatment, thereby attaining a high carrier injection efficiency.

As for the electrode materials used in the present invention, examples of the anode materials may include indium oxide, tin oxide, $Cd_2SnO_4$, zinc oxide, copper iodide, gold and platinum, in addition to ITO. Examples of the cathode materials may include alkali metals, alkaline earth metals and alloys of these, inclusive of sodium, potassium, magnesium, lithium, sodium-potassium alloy, magnesium-indium alloy, magnesium-silver alloy, aluminum, aluminum-lithium alloy, aluminum-copper alloy, aluminum-copper-silicon alloy.

As for the protective layer material having a carrier transporting characteristic, it is preferred to use a material having a large molecular volume so as to exhibit little diffusivity into the conductive liquid crystal used in the carrier transporting layer. The protective layer material may preferably be one not having a liquid crystal phase of an order equivalent to or lower than that of a disordered phase; more preferably, it is a non-liquid crystal material. The protective layer may preferably have a principal charge carrier type identical to that of the carrier transporting layer. The protective layer may exhibit selective transportability for either one of holes or electrons as the charge carrier. The protective layer material may preferably have a band gap broader than that of the carrier transporting layer material.

Specific examples of the protective layer material may include the following:

α-NPD: bis[N-1-(naphthyl)-N-phenyl]benzidine,
1-TANTA: 4,4',4"-tris(1-naphthylphenylamino) triphenylamine,
2-TANTA: 4,4',4"-tris(2-naphthylphenylamino) triphenylamine,
TCTA: 4,4',4"-tris(N-carbazoyl)triphenylamine,
p-DPA-TDAB: 1,3,5-tris[N-(4-diphenylaminophenyl) phenylamino]benzene,
TDAB: 1,3,5-tris(diphenylamino)benzene,
DTATA: 4,4',4"-tris(diphenylamino)triphenylamine,
TDAPB: 1,3,5-tris[(diphenylamino)phenyl]benzene.

For reference, α-NPD is represented by the following structural formula:

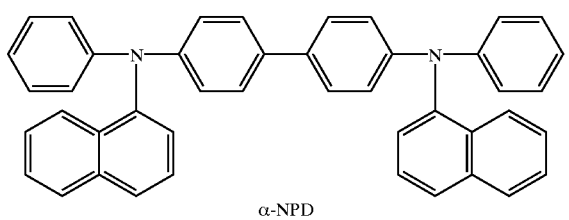

α-NPD

Further, examples of materials for the luminescent organic layer may include in addition to Alq3, BeBq (bis (benzoquinolinolato)beryllium), DTVB2 (4,4'-bis(2,2-di-p-tolylvinyl)biphenyl), Eu(DBM)3(Phen) (tris(1,3-diphenyl-1,3-propanediono)monophenanthroline)Eu(III)), and further, diphenylethylene derivatives, triphenylamine derivatives, diaminocarbazole derivatives, bis-styryl derivatives, benzothiazole derivatives, benzoxazole derivatives, aromatic diamine derivatives, quinacridone compounds, perylene compounds, oxadiazole derivatives, coumarin compounds, and anthraquinone derivatives. These materials are preferably formed in an amorphous state by vacuum deposition.

FIG. 1 is a schematic sectional view showing a basic structure of an embodiment of the organic EL device according to the present invention. Referring to FIG. 1, the organic EL device includes a transparent substrate 1, an anode (transparent electrode, e.g., ITO) 2, a carrier transporting layer 3, a protective layer 4, a luminescent organic layer 5 and a cathode 6, laminated in this order. In this embodiment, the carrier transporting layer 3 comprises a hole-transporting conductive liquid crystal having a HOMO close to the energy level of ITO constituting the anode 2 and is disposed in contact with the anode 2. A carrier transporting layer comprising a conductive liquid crystal having an electron-transporting characteristic and disposed in contact with the cathode 6 is expected to have a similar effect of improving the carrier injection from the electrode.

Hereinbelow, the present invention will be described more specifically based on examples.

EXAMPLE 1

Figure 2:
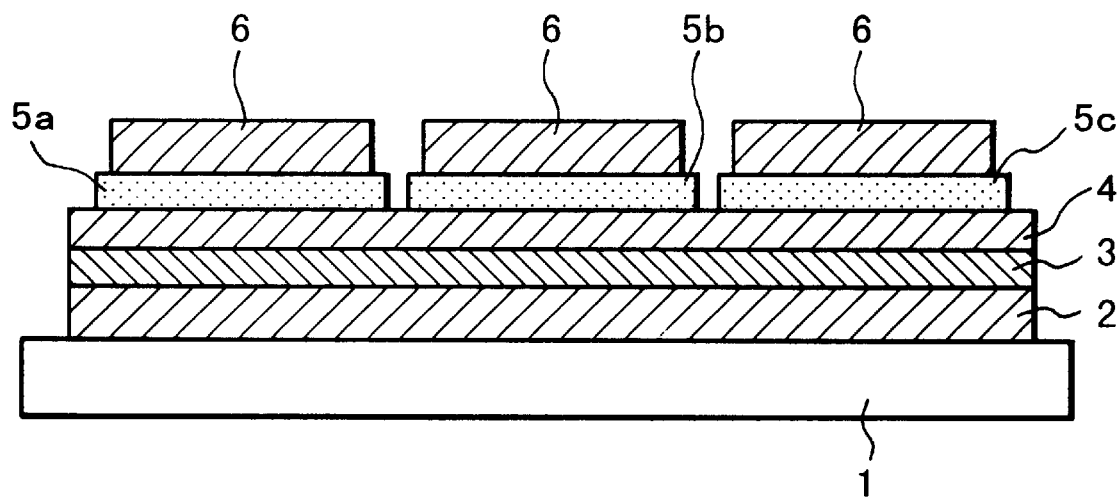
FIG. 2 is a schematic sectional view of an organic EL device prepared in an example.

An organic EL device having a sectional structure as shown in FIG. 2 was prepared. FIG. 2 shows a similar structure as in FIG. 1, but shows luminescence layers 5a, 5b and 5c of different colors instead of the single luminescence layer 5 in FIG. 1.

More specifically, on a glass substrate 1 held at 200° C., a 70 nm-thick ITO film was formed as a hole-injecting anode 2 by sputtering using a target of In 90% and Sn 10% while flowing Ar gas at 200 sccm and $O_2$ gas at 3 sccm. The ITO film showing a work function of ca. 4.35 eV was exposed to ultraviolet rays from a low-pressure mercury lamp to have an elevated work function of 4.60 eV.

The above-treated substrate 1 having an ITO film 2 was placed in a vacuum chamber held at a pressure below $2 \times 10^{-5}$ torr, and a ca. 50 nm-thick layer of HHOT (hexakis (hexyloxy)triphenylene) was formed on the ITO film 2 as a carrier transporting layer 3 by vacuum deposition at a rate of ca. 0.1 nm/sec at a pressure of $1 \times 10^{-5}$ torr according to the resistance heating vacuum deposition method. HHOT exhibited a mobility of $1 \times 10^{-3}$ $cm^2$/V.sec at ca. 70° C. or below according to the time-of-flight method when sandwiched in a 15 µm-thick layer between a pair of ITO substrates. Incidentally, HHOT is a discotic liquid crystal having a transition from crystal to discotic disordered phase at 65° C. and a transition to isotropic phase at 98° C.

Then, on the HHOT layer 3, a protective layer 4 of α-NPD was formed in a thickness of 50 nm by vacuum deposition at a rate of ca. 0.1 nm/sec under a pressure of $1 \times 10^{-5}$ torr.

Luminescent organic layer segments 5a–5c exhibiting different luminescent wavelengths were respectively formed in a thickness of 50 nm on the protective layer 4 by vacuum deposition through a mask under the conditions of a pressure of $1 \times 10^{-5}$ torr and a deposition rate of ca. 0.1 nm/sec. The organic layers 5a–5c were respectively formed of Alq3 alone, Alq3 doped with 5 wt. % of perylene for shifting the luminescence wavelength to a shorter wavelength side, and Alq3 doped with 5 wt. % of DCM (a styryl dye) for shifting to a longer wavelength side. The structural formulae for the above-mentioned perylene and DCM are shown below.

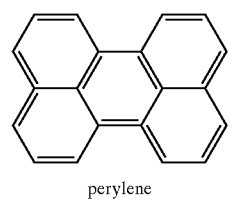

perylene

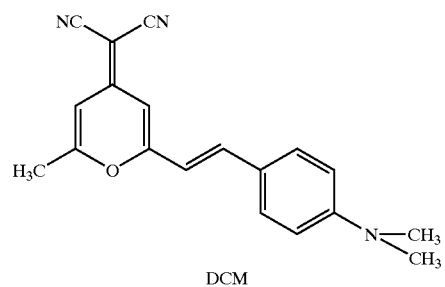

DCM

The above-prepared organic layers 5a–5c were respectively coated with cathode metals 6 each comprising a 50 nm-thick layer of Al—Li alloy (Li content=1.8 wt. %) and a 150 nm-thick Al layer, respectively formed by vacuum deposition, to obtain an organic EL device having a structure as shown in FIG. 2.

Comparative Example 1

An organic EL device was prepared in the same manner as in Example 1 except the protective layer 4 of α-NPD was not formed.

The organic EL devices of Example 1 and Comparative Example 1 prepared in the above-described manner were respectively heated to 65° C., whereby electroluminescence was realized at an increased current at that temperature in the respective devices. The device of Example 1 exhibited a remarkably larger current and correspondingly increased luminescence. The current flow is believed to depend on the state of the boundary between the liquid crystal layer and the adjacent layer and has been increased by the insertion of a protective layer as in the present invention.

The reason for the current increase attained by the protective layer of α-NPD in Example 1 may be attributable to a feature that a bulky molecule like α-NPD shows a suppressed diffusivity into the liquid crystal layer, thus not obstructing the carrier conduction, whereas a spherical molecule like Alq3 is liable to be diffused into the liquid crystal layer, thus forming carrier traps at the boundary. The current densities measured at an electric field intensity of 8 V/100 nm for the devices of Example 1 and Comparative Example 1 are shown in Table 1 below together with some related features.

TABLE 1

| Example | Layer structure | Temp. (° C.) | Current (mA/cm$^2$) | Phase of HHOT |
|---|---|---|---|---|
| 1 | ITO/HHOT/α-NPD/ Alq3/AlLi | 30 | 8.0 | crystal |
|   |   | 65 | 300.0 | Dd* |
| Comp. 1 | ITO/HHOT/Alq3/AlLi | 30 | 0.1 | crysal |
|   |   | 65 | 2.0 | Dd* |

*Dd: discotic disordered phase

As shown in Table 1, the devices of both Example 1 and Comparative Example 1 exhibited increased currents at 65° C. The alignment of liquid crystal (HHOT) in the carrier transporting layer on the ITO electrode was confirmed such that the discotic columns thereof were aligned substantially vertical to the electrode surface. (The liquid crystal alignment was confirmed by sample devices having corresponding structures except for a reduced cathode thickness of 10 nm by observation through a right-angle cross-nicol polarizing microscope. A similar alignment was observed at an increased liquid crystal layer thickness of 150 nm.) The increased currents were also retained at 70° C. or higher.

EXAMPLE 2

An organic EL device was prepared in the same manner as in Example 1 except that the HHOT layer thickness was reduced to ca. 20 nm, and the cathode Al-Li layer was reduced to 10 nm.

Comparative Example 2

An organic EL device was prepared in the same manner as in Example 1 except that the HHOT layer was omitted, the α-NPD layer thickness was increased to ca. 60 nm, and the Alq3 layer thickness was increased to ca. 60 nm.

The devices of Example 2 and Comparative Example 2 were driven at various temperatures at an electric field intensity of 7.8 V/100 nm. The device of Comparative Example 2 was also driven at an electric field intensity of 7.5 V/100 nm (Comparative Example 2A). The temperature-dependencies of current densities of the respective devices thus measured are summarized in FIG. 3.

Figure 3:
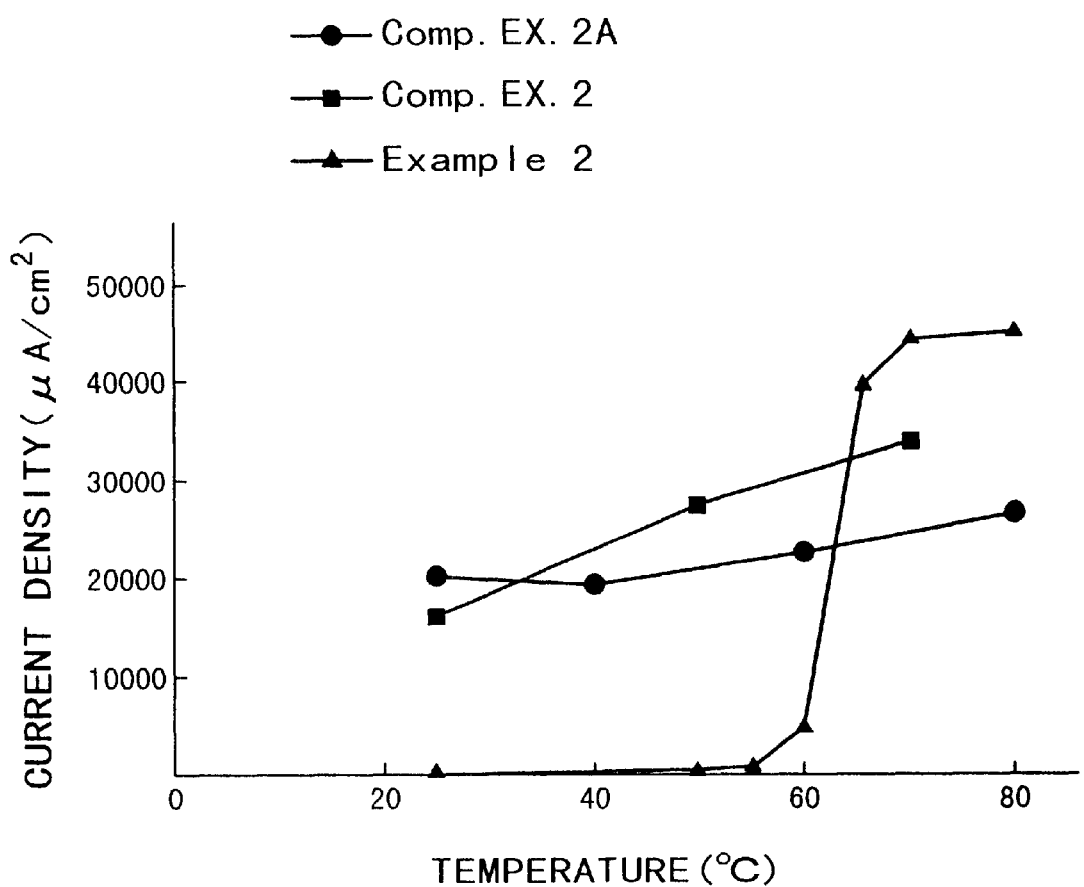
FIG. 3 is a graph showing temperature-dependence of current densities of organic EL devices prepared in Example 2 and Comparative Examples 2 and 2A.

As is clear from FIG. 3, the device of Example 2 exhibited a remarkable increase in current density at liquid crystal phase temperatures of HHOT due to realignment of HHOT.

EXAMPLE 3

An organic EL device was prepared in the same manner as in Example 1 except for using PFT-1 instead of HHOT as a conductive liquid crystal and reducing the cathode Al-Li alloy layer thickness to 10 nm. The PFT-1 layer was formed in a thickness of 20 nm by vacuum deposition at a rate of ca. 0.1 nm/sec under a pressure of $1\times10^{-5}$ torr. PFT-1 had a phase transition from crystal to discotic disordered phase (liquid crystal phase) at 54.7° C. and a phase transition from the discotic disordered phase to isotropic phase at 133.1° C.

Comparative Example 3

An organic EL device was prepared in the same manner as in Example 3 except for omitting the α-NPD layer.

The devices of Example 3 and Comparative Example 3 were driven at an elevated temperature of 60° C., whereby electroluminescence was realized by the respective devices. The current densities measured at an electric field intensity of 10 V/100 nm for the devices are shown in Table 2 below together with the related features.

TABLE 2

| Example | Layer structure | Temp. (° C.) | Current (mA/cm$^2$) | Phase of PFT-1 |
|---|---|---|---|---|
| 3 | ITO/PFT-1/α-NPD/ Alq3/AlLi | 30 | 0.1 | crystal |
|   |   | 60 | 15.0 | Dd* |
| Comp. 3 | ITO/PFT-1/Alq3/AlLi | 30 | 0.1 | crysal |
|   |   | 60 | 9.5 | Dd* |

*Dd: discotic disordered phase

As shown in Table 2, the devices of both Example 3 and Comparative Example 3 exhibited increased currents at 60° C. The alignment of liquid crystal (PFT-1) in the carrier transporting layer on the ITO electrode was confirmed such that the discotic columns thereof were aligned substantially vertical to the electrode surface. (The liquid crystal alignment was confirmed by sample devices having corresponding structures except for a reduced cathode thickness of 10 nm by observation through a right-angle cross-nicol polarizing microscope. A similar alignment was observed at an increased liquid crystal layer thickness of 150 nm.) The increased currents were also retained at 70° C. or higher.

EXAMPLE 4

An organic EL device having an electron-injecting liquid crystal layer in contact with a cathode and a hole-blocking protective layer in contact with the liquid crystal layer was prepared.

More specifically, on a 70 nm-thick ITO film formed on a glass substrate similarly as in Example 1, a 50 nm-thick α-NPD layer was formed by vacuum deposition at a rate of ca. 0.1 nm/sec at a pressure of $1\times10^{-5}$ torr, and further thereon a 50 nm-thick layer of Alq3 was formed by vacuum deposition under similar conditions.

Then, on the Alq3 layer, a ca. 7 nm-thick layer of BCP (2,9-dimethyl-4,7-diphenyl-1,10-phenanthroline represented by a structural formula shown below) was formed by vacuum deposition under similar conditions, and further thereon a 15 nm-thick electron-injecting layer of QQ77a (represented by a structural formula shown below). Then, the QQ77a layer was coated with a cathode metal comprising a 10 nm-thick layer of Al—Li alloy (Li content=0.8 wt. %) and a 150 nm-thick Al layer.

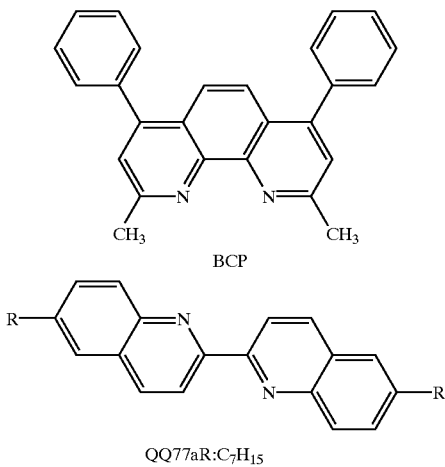

QQ77aR:C$_7$H$_{15}$

QQ77a assumes a liquid crystal phase as a super-cooled phase at room temperature. BCP and QQ77a commonly have an acceptor characteristic, and BCP has a band gap of ca. 3.3 eV which is somewhat broader than ca. 3.1 eV of QQ77a.

In such a device structure of ITO/αNPD/Alq3/BCP/QQ77a/AlLi/Al as prepared above, αNPD, Alq3 and BCP have HOMO levels of ca. 5.4 eV, 5.8 eV and 6.5 eV, respectively, relative to a work function 4.7 eV of ITO, so that holes injected from ITO are accumulated at Alq3/BCP layers and do not move to the BCP/QQ77a boundary or the QQ77a layer.

On the other hand, as αNPD, Alq3 and BCP have LUMO levels of ca. 2.5 eV, 2.9 eV and 3.2 eV, respectively, electrons injected from the cathode pass through the QQ77a layer, BCP layer and Alq3 layer and then are blocked by the αNPD layer, so that excited molecules of Alq3 are effectively formed to cause luminescence.

At this time, the electrons enhancively injected by the QQ77a layer are supplied to the Alq3 layer, but the holes do not move to the QQ77a layer, so that excimers of QQ77a molecules or exciplexes of QQ77a and BCP are not formed, whereby luminescence efficiency can be improved.

The above-prepared device of ITO/αNPD/Alq3 /BCP/QQ77a/AlLi/Al exhibited a luminescence efficiency of 7.9 lm/w, whereas a comparative device of ITO/αNPD/Alq3/QQ77a/AlLi/Al lacking the BCP layer exhibited 3.0 lm/w, showing an improvement by the BCP layer.

Further, a reference device having a structure of ITO/αNPD/Alq3/QQ77a/AlLi/Al having a total organic layer thickness of 115 nm exhibited a current density of 140 mA/cm$^2$ at a voltage of 10 volts, whereas a comparative device structure of ITO/αNPD/Alq3/AlLi/Al lacking the QQ77a layer and having a total organic layer thickness of 100 nm exhibited only a lower current density of 60 mA/cm$^2$ at an identical voltage of 10 volts giving a higher electric field intensity, thus showing an increase of current density by the presence of the QQ77a layer.

As described above, in the conductive liquid crystal device of the present invention, a protective layer having a carrier transporting function is inserted between a conductive liquid crystal layer as a carrier transporting layer contacting an electrode and a functional organic layer, whereby deterioration, such as the occurrence of molecular association (exciplex), at the boundary between the liquid crystal layer and the organic layer, can be effectively prevented. As a result, in the organic EL device of the present invention including a luminescent organic layer, a sufficient luminescence can be attained at a low voltage to reduce power consumption and prevent short circuit between the electrodes thereby improving the reliability of the organic EL device.

The conductive liquid crystal device of the present invention can be utilized not only in such an organic EL device but also in other electron devices, such as a photosensor, a photoconductor (as in electrophotographic apparatus), an organic semiconductor device (organic TFT), and a spatial modulation device.

What is claimed is:

1. A conductive liquid crystal device comprising:
   (A) a pair of oppositely spaced electrodes; and
   (B1) a carrier transporting layer disposed in contact with one of the electrodes and comprising a conductive liquid crystal having a π-electron resonance structure in its molecule,
   (B2) a protective layer disposed in contact with the carrier transporting layer and having a carrier transporting function, and
   (B3) an organic layer disposed in contact with the protective layer, respectively disposed between the electrodes;
   wherein the carrier transporting layer is formed by vacuum deposition and realigned such that the π-resonance structure of the conductive liquid crystal molecule is aligned in a plane substantially parallel to a surface of one of said electrodes.

2. An organic electroluminescence device comprising:
   (A) a pair of oppositely spaced electrodes; and
   (B1) a carrier transporting layer disposed in contact with one of the electrodes and comprising a conductive liquid crystal having a π-electron resonance structure in its molecule,
   (B2) a protective layer disposed in contact with the carrier transporting layer and having a carrier transporting function, and
   (B3) a luminescent organic layer disposed in contact with the protective layer,
   respectively disposed between the electrodes;
   wherein the carrier transporting layer is formed by vacuum deposition and realigned such that the π-resonance structure of the conductive liquid crystal molecule is aligned in a plane substantially parallel to a surface of one of said electrodes.

3. The electroluminescence device according to claim 2, wherein the protective layer comprises a non-liquid crystal material.

4. The electroluminescence device according to claim 2, wherein the luminescent organic layer has been formed by vacuum deposition.

5. The electroluminescence device according to claim 2, wherein the luminescent organic layer is in an amorphous state.

6. The electroluminescence device according to claim 2, wherein the conductive liquid crystal comprises a discotic liquid crystal.

7. The electroluminescence device according to claim 2, wherein the carrier transporting layer and the protective layer have an identical type of principal charge carrier.

8. The electroluminescence device according to claim 2, wherein the protective layer selectively transports either holes or electrons.

9. The electroluminescence device according to claim 2, wherein the conductive liquid crystal comprises a smectic liquid crystal.

10. The electroluminescence device according to claim 2, wherein the protective layer has a band gap broader than a band gap of the carrier transporting layer.

* * * * *

UNITED STATES PATENT AND TRADEMARK OFFICE
CERTIFICATE OF CORRECTION

PATENT NO. : 6,528,940 B1
DATED : March 4, 2003
INVENTOR(S) : Shinjiro Okada et al.

It is certified that error appears in the above-identified patent and that said Letters Patent is hereby corrected as shown below:

<u>Title page,</u>
Item [74], *Attorney, Agent, or Firm*, "Fitzpatrick Cella Harper & Scinto" should read
-- Fitzpatrick, Cella, Harper, & Scinto --.

<u>Column 12,</u>
Line 33, "layer, respectively disposed" should read
-- layer,
respectively disposed --.

Signed and Sealed this

Thirteenth Day of January, 2004

JON W. DUDAS
*Acting Director of the United States Patent and Trademark Office*